United States Patent [19]

Hlavka

[11] 4,095,168
[45] June 13, 1978

[54] RF PICK-UP COIL CIRCUIT FOR A WIDE TUNING RANGE NUCLEAR MAGNETIC RESONANCE PROBE

[75] Inventor: Lloyd F. Hlavka, Palo Alto, Calif.

[73] Assignee: Varian Associates, Inc., Palo Alto, Calif.

[21] Appl. No.: 770,477

[22] Filed: Feb. 22, 1977

[51] Int. Cl.² .......................................... G01R 33/08
[52] U.S. Cl. ........................... 324/0.5 AH; 324/0.5 R
[58] Field of Search .......... 324/0.5 R, 0.5 A, 0.5 AH, 324/0.5 AC

[56] References Cited

U.S. PATENT DOCUMENTS

| | | | |
|---|---|---|---|
| 3,404,332 | 10/1968 | Abragam et al. | 324/0.5 R |
| 3,714,553 | 1/1973 | Keller | 324/0.5 AC |
| 3,795,855 | 3/1974 | Browning | 324/0.5 R |

*Primary Examiner*—M. Tokar
*Attorney, Agent, or Firm*—Stanley Z. Cole; Gerald M. Fisher; Edward H. Berkowitz

[57] ABSTRACT

In a wide tuning range nuclear magnetic resonance spectrometer, the probe structure includes a series resonant pick-up coil circuit disposed in RF magnetic field exchanging relation with the sample under analysis for detecting nuclear magnetic resonance of the sample. A variable capacitor is series resonated with the inductance of the pick-up coil and the capacitor is arranged for tuning the series resonance of the pick-up coil over a wide tuning range, for example, from 6 to 32 megahertz. The low series resonant impedance of the pick-up coil, as of 1.5 to 5 Ω, is matched to the relatively high input impedance, as of 50 ohms, of a low noise RF amplifier by means of a pair of series connected transmission line transformers for transforming the 50 ohm input impedance of the amplifier to the low series resonance impedance of the pick-up coil. The transmission line transformers are formed of two wire lines, one wire being connected in series with the pick-up coil and the other wire being arranged so that a current is induced to flow therein due to the distributed inductance and capacitance of the two wire line. The induced current is added, at the low impedance end of the transformer, to the current flowing in the first wire, whereby a broadband impedance transformer is obtained. Two such transformers are employed in series with the pick-up coil for transforming the low impedance of the coil to the relatively high input impedance of the preamplifier. The transformers are broadband so that the impedance is well matched over the entire tuning range of 6 to 32 megahertz.

12 Claims, 7 Drawing Figures

FIG. I

RF PICK-UP COIL CIRCUIT FOR A WIDE TUNING RANGE NUCLEAR MAGNETIC RESONANCE PROBE

BACKGROUND OF THE INVENTION

The present invention relates in general to nuclear magnetic resonance spectroscopy and more particularly to an improved RF pick-up coil circuit and impedance matching transformer circuit for matching the impedance of the series resonance pick-up coil to the impedance of the preamplifier.

DESCRIPTION OF THE PRIOR ART

Heretofore, nuclear magnetic resonance probe circuits for sensing nuclear magnetic resonance in the sample under analysis have been proposed which have been series resonant at the nuclear magnetic resonant frequency. These series resonant pick-up coils have been impedance matched to the receiver amplifier circuitry by means of impedance matching lumped element transformers typically comprising either a voltage dividing capacitor or an inductive transformer coupling.

An example of a prior art nuclear magnetic resonance probe and pick-up coil circuit which is series resonant is disclosed and claimed in U.S. Pat. No. 3,434,043 issued Mar. 18, 1969 and assigned to the same assignee as the present invention.

The problem with such prior probe circuits is that the series resonant impedance of the pick-up circuit is relatively low, as on the order of a few ohms, corresponding to the resistive losses of the RF coil. On the other hand, the input impedance to a low noise amplifier is typically on the order of 50 ohms or more. Thus, a substantial impedance mismatch is encountered between the series resonant pick-up coil and the receiver input. While this impedance can be matched at one frequency, the maximum tuning range thus far obtainable has been on the order of two to one, i.e., from 6 megahertz to 12 megahertz.

However, there is a need for a probe circuit that can be utilized for sensing nuclear magnetic resonance of a number of different nuclei without having to change the probe circuit. More particularly, it is desired to provide a tunable pick-up probe circuit that can be tuned over the nuclear magnetic resonance bands of $^{14}N$ at 6 megahertz through $^{31}P$ at 32 megahertz and also include within this tuning range the nuclei of $^{13}C$ at 20 megahertz; $^2H$ at 12 megahertz; and $^{15}N$ at 8 megahertz. The probe circuit should preferably have high sensitivity over this entire tuning range and thus the series resonant impedance of the pick-up coil should be well matched to the input impedance of the amplifier over this range.

SUMMARY OF THE PRESENT INVENTION

The principal object of the present invention is the provision of an improved nuclear magnetic resonance pick-up coil circuit for use in a nuclear magnetic resonance spectrometer tunable over a relatively wide band such as from a first low frequency to an upper frequency several times the value of the low frequency.

In one feature of the present invention, a series resonant tuned RF pick-up coil has its series resonance impedance matched to the input impedance of a radio frequency amplifier via the intermediary of a transmission line transformer of the type wherein the distributed mutual inductance and capacitance of a two wire line is employed to induce a current in the second wire which is added in phase with the current in the first wire at the low impedance end of the respective transformer so that the impedance at the high impedance end of the transformer is an integral number times the impedance at the low impedance end of the transformer and so that the impedance match is broadband.

In another feature of the present invention, the transmission line transformer comprises a twisted pair of conductors, preferably coiled into a coil.

In another feature of the present invention, the transmission line transformer comprises a series connection of a plurality of individual transmission line transformers for providing a larger overall impedance transformation ratio between the impedance of the pick-up coil and the input impedance of the RF amplifier.

In another feature of the present invention, the transmission line transformer includes at least a pair of parallel connected transmission line transformers for reducing the characteristic impedance of the composite transmission line transformer.

In another feature of the present invention, the transmission line transformer is free of ferromagnetic material to facilitate placement of the transformer means in the immediate vicinity of the nuclear magnetic resonance sample without unduly perturbing the polarizing magnetic field in the region of the sample.

Other features and advantages of the present invention will become apparent upon a perusal of the following specification taken in connection with the accompanying drawings wherein:

DESCRIPTION OF THE PREFERRED EMBODIMENTS

Figure 1:
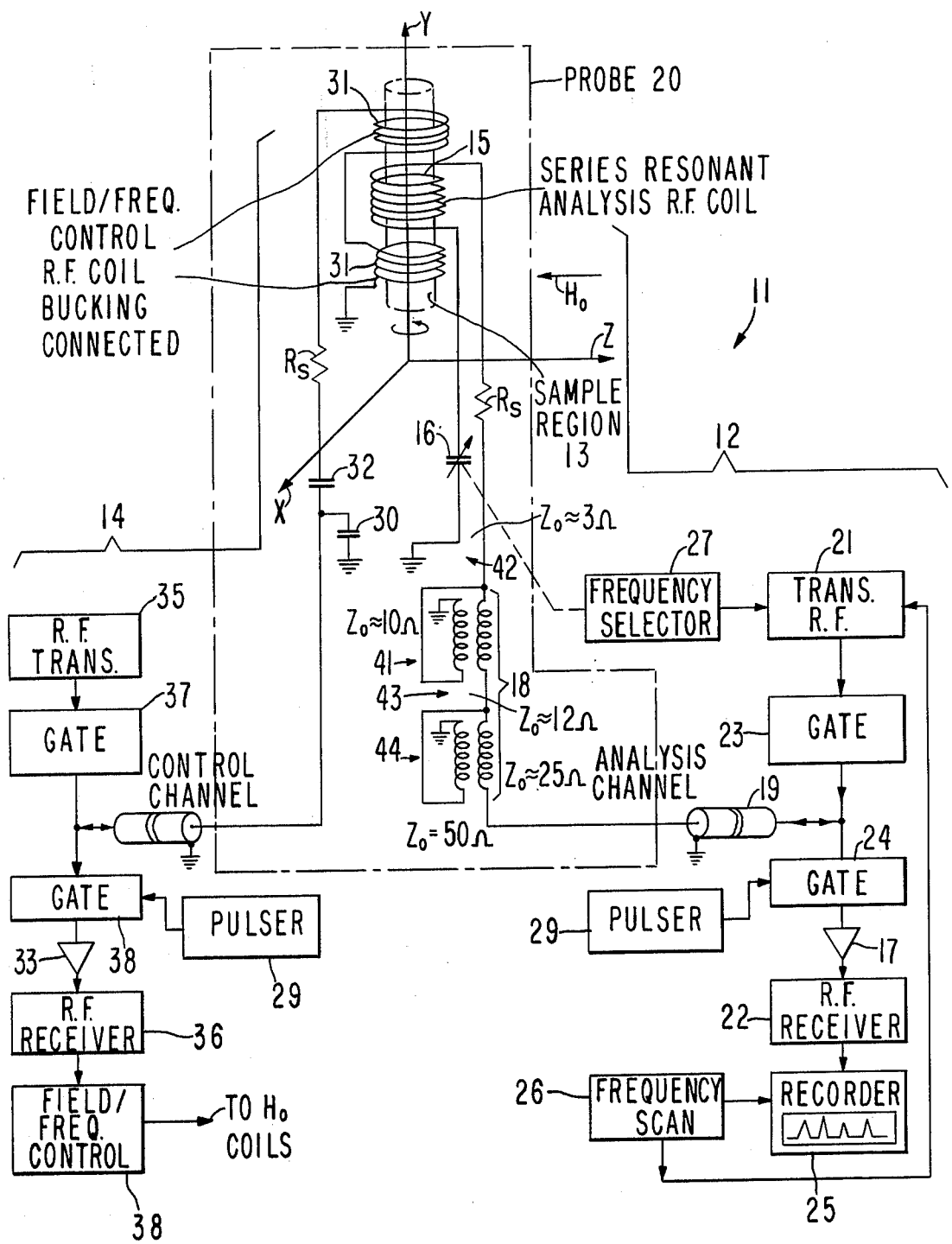
FIG. 1 is a schematic circuit diagram, partly in block diagram form, of a nuclear magnetic resonance spectrometer incorporating features of the present invention.

Referring now to FIG. 1 there is shown a wide tuning range nuclear magnetic resonance spectrometer 11 incorporating features of the present invention. The spectrometer 11 includes an analysis channel portion 12 for exciting and detecting nuclear magnetic resonance of a sample under analysis disposed within a tubular sample region 13 and a field frequency control channel 14 for exciting and detecting resonance of a control group of nuclear resonance bodies for controlling the resonance condition of the sample under analysis.

The sample under analysis within the sample region 13 is disposed in RF magnetic field exchanging relation with an RF magnetic pick-up coil 15, as of 1.6$\mu$h inductance comprising 14 turns of approximately 10 millimeter diameter, the coil being approximately 9 millimeters long. The coil 15 is series resonated with a variable capacitor 16 having a capacitance variable between a value of approximately 10 pf to a value of approximately 400 pf for tuning the series resonance of the RF pick-up coil 15 over a relatively wide tuning range, as of from 6 megahertz to 32 megahertz. The series resonant pick-up coil 15 includes a certain amount of resistance which appears as a series resistance $R_s$. In a typical example, the series resistance $R_s$ is approximately 3 ohms. The Q of the series tuned resonance circuit has a value of approximately 50.

The pick-up analysis coil 15 is wound around the sample region 13 with a magnetic axis parallel to the Y axis in the Cartesian set of coordinates, as shown. The sample is preferably spun by means of a conventional spinner with the axis of revolution being parallel to the Y axis. A polarizing magnetic field $H_O$, as of 18 kilogauss, is directed through the sample region 13 parallel to the Z axis. The series resonant analysis RF pick-up coil 15 is coupled to the input of an RF preamplifier 17 via the intermediary of a two stage transmission line impedance transformer 18 for matching the relatively low series resonant impedance, as of 1.5 to 5 ohms, of the series resonant pick-up coil to the input impedance of the amplifier 17, as of 50 ohms.

The transformer 18 and coil 15 are preferably disposed within a probe housing 20 disposed between the pole pieces of a magnet utilized for producing the polarizing field $H_O$. The output of the transformer 18 is coupled via a length of 50 ohm coaxial line 19 to a connection between an RF transmitter 21 and the RF preamplifier 17 and between respective gates 23 and 24. The RF preamplifier 17 feeds its output into an RF receiver 22 which receives the nuclear magnetic resonance signal picked up by the pick-up coil 15 and detects the preamplified received signal to produce a DC output resonance signal proportional to the amplitude of the detected resonance of the sample under analysis. The DC resonance signal is fed to a recorder 25 for recording as a function of frequency of the transmitter 21 which is scanned by means of a frequency scan output derived from frequency scanner 26 so that the output of the recorder is a recorded nuclear magnetic resonance spectrum of the sample under analysis.

One output of the frequency scan 26 is employed for controlling the frequency of the RF transmitter 21 for scanning the frequency of the RF transmitter 21 over a certain narrow range of frequencies, as of a few thousand hertz centered about the center frequency of the RF transmitter. The center frequency $f_O$ of the RF transmitter 21 is also tuned to the frequency bands of the several different nuclei under analysis falling within a frequency range of 6 to 32 megahertz. For example, a frequency selector 27 permits selection of a center frequency for the RF transmitter 21 of approximately 6 megahertz for the nuclei of $^{14}$N; 8 megahertz for the nuclei of $^{15}$N; 12 megahertz for the nuclei of $^2$H 20 megahertz for the nuclei of $^{13}$C and 32 megahertz for the nuclei of $^{31}$P. The frequency selector 27 also includes a tuning control for tuning the value of capacitor 16 for tuning the series resonant frequency of the series tuned pick-up coil 15 to the respective nuclear magnetic resonance frequencies of the aforecited nuclei.

The nuclear magnetic resonance spectrometer 11 is a spectrometer of the single coil type, that is, a common RF coil 15 serves both as the coil for applying the nuclear magnetic resonance exciting field to the sample under analysis and for picking up the resultant nuclear resonance of the sample. This is accomplished by time share multiplexing the transmitter 21 and the receiver 22 so that the transmitter sends out a pulse for exciting the resonance and then during an off period, the receiver 22 is gated on for receiving the resonance signal emanating from the excited sample under analysis.

The transmitter gate 23 may comprise a pair of parallel connected reverse poled diodes such that when the amplitude of the RF transmitter pulse exceeds a predetermined threshold value the pulse passes through the transmitter gate 23 by turning on the diodes and thence passes through the gate 23 to the coil 15.

A pulser 29, synchronized with the RF transmitter 21, preferably is employed for pulsing the receiver gate 24 on during the off times of the RF transmitter so that resonance signals picked up in the pick-up coil 15 pass through the receiver gate 24 to the preamplifier 17 and receiver 22, but strong RF transmitter pulses are blocked from the preamplifier 17 and receiver 22.

The field frequency control channel 14 includes means for exciting and detecting resonance of a control group of nuclear magnetic resonance bodies disposed within the sample region 13 to derive a signal for controlling the magnitude of the polarization field $H_O$ to a predetermined value related to the resonance frequency of the known field frequency control sample. More particularly, the field frequency control channel 14 includes an RF exciting and detecting coil 31 coaxially disposed of the sample of the analysis coil 15 with the coil 31 being axially separated into two equal portions disposed at opposite ends of the analysis coil 15. The coil portions 31 are oppositely wound relative to the series current flow therethrough so that the RF fields produced by said separate portions cancel in the region bounded by the analysis coil 15. This is accomplished, in one embodiment, by causing the two halves of the field frequency RF coil 31 to be bucking wound so that the RF magnetic field generated in each half cancels in the center of the analysis coil 15. The field frequency RF coil 31 is tuned and impedance matched to 50 $\Omega$ by means of capacitors 30 and 32 at the nuclear magnetic resonant frequency of the control group of nuclei.

The tuned field frequency control coil 31 is coupled via a coaxial line 34 to a node between a control RF transmitter 35 and a control RF preamplifier 33 and receiver 36 and between respective gates 37 and 38. The gates 37 and 38 operate in the same manner as gates 23 and 24 for time share multiplexing the transmitter pulses to the received pulses from the control group of nuclear magnetic resonators.

The DC resonance signal derived from the output of the control RF receiver 36 is fed to a field frequency controller 38 to derive an output for driving a set of electromagnetic coils, not shown, used to control the total magnitude of the magnetic field $H_O$. The field frequency control signal derived from field frequency controller 38, has a magnitude and sign so as to sustain resonance of the field/frequency control group of nuclear magnetic resonators so that the intensity of the polarizing magnetic field $H_O$ is locked to the resonance of the control group of nuclear magnetic resonators. A pulser 29 drives the receiver gate 38 so as to gate on the receiver during the off time of the RF transmitter 35.

Figure 2:
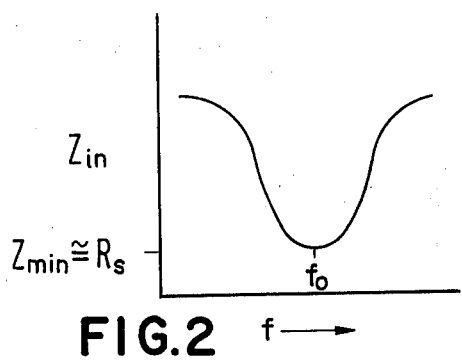
FIG. 2 is a plot of input impedance versus frequency to a series resonant RF pick-up coil.
Figure 3:
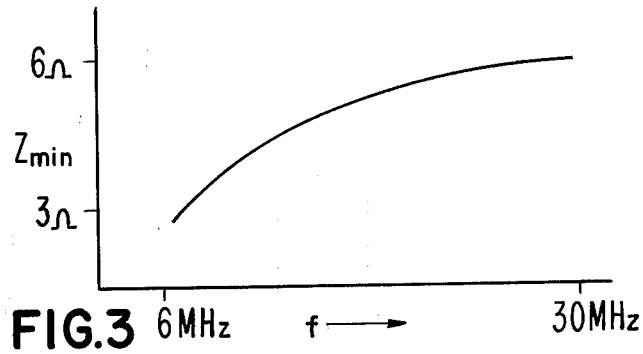
FIG. 3 is a plot of minimum input impedance versus frequency for the series resonant pick-up coil of the present invention.
Figure 4:
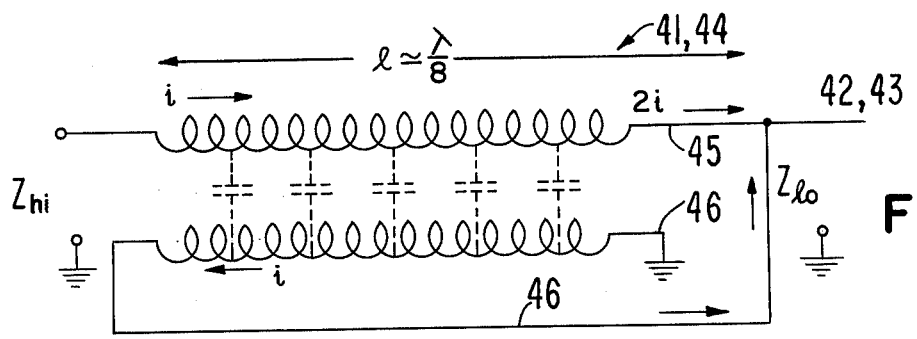
FIG. 4 is a schematic line diagram of a transmission line transformer employed in the circuit of FIG. 1.

Referring now to FIGS. 1-8, the transmission line transformer 18 is described in greater detail. The impedance looking into the series resonant tuned analysis RF coil 15 varies with frequency as shown in FIG. 2. This is the typical series resonance impedance characteristic and the inut impedance has a minimum $Z_{min}$ which is approximately equal to the series resistance $R_s$ of the RF coil 15 at the series resonant frequency $f_0$ of the pick-up coil 15. As the pick-up coil is tuned in frequency from a series resonance at 6 megahertz to a series resonance at 30 megahertz, $Z_{min}$ varies from a minimum of 1.5 Ω at 6 megahertz to a maximum of approximately 5 ohms at 30 megahertz, as shown in FIG. 3.

The transmission line transformer 18 serves the purpose of matching $Z_{min}$ to the impedance of the preamplifier 17, as of approximately 50 ohms, over the tuning range of from 6 megahertz to in excess of 30 megahertz. The composite transformer 18 includes, a series connection of two transformer sections 41 and 44, each of the type schematically indicated in FIG. 4. The first transformer section 41 (FIG. 1) matches the characteristic impedance of the transmission line looking into the series tuned resonance pick-up coil 15, such line having a characteristic impedance $Z_O$ of approximately 3 ohms to the characteristic impedance of a transmission line section 43 forming the input to a second series connected transmission line transformer 44. The characteristic impedance $Z_O$ of the line at 43 is approximately 12 ohms. The characteristic impedance $Z_O$ at the high impedance end of the second transformer section 44 is approximately 50 ohms corresponding to the characteristic impedance of the line feeding into the input of the RF preamplifier 17. Thus, each transformer section 41 and 44 provides a four to one impedance transformation ratio for an overall impedance transformation ratio of 16 between the low impedance as of 3 ohms of the tuned pick-up coil 15 and the 50 ohm input impedance to the preamplifier 17.

Each of the transformer sections 41 and 44 (FIG. 4) comprises a length of two wire transmission line, one of the wires 45 being series connected for series resonance current flow between the series resonant pick-up coil 15 and the input to the preamplifier 17. The other wire 46 of the two wire line is grounded at the low impedance end 42, 43 of the respective transformer section 41 or 44, respectively, and the high impedance end of the second wire 46 is connected to the low impedance end of the first wire 45 at 42 or 43, respectively.

The distributed mutual inductance and capacitance between the two wires 45 and 46 causes the series current flowing in the first conductor 45 to induce an equal and opposite current in the second conductor 46. This out-of-phase current in the second conductor is coupled back to the low impedance end of the transformer section 41 or 44 so that the two currents, namely the series current and the induced current of equal magnitude, add in phase at the low impedance end of the transformer. Since the power into the transformer section is equal to the power out and since the current at the low impedance end is twice the current at the high impedance end the impedance transformation ratio goes as the square of the current so that the impedance at the high impedance end is four times the impedance at the low impedance end.

The length l of each of the transformer sections 41 or 44 is preferably about ⅛ of a wavelength at the high frequency end of the tunable band of the series resonant pick-up coil circuit. Two such transformer sections, series connected relative to each other, thus provide a 16:1 impedance transformation which serves to transform the relatively low impedance of 3 ohms at the input to the series resonant pick-up coil 15 to the higher input impedance of the preamplifier 17.

Figure 5:
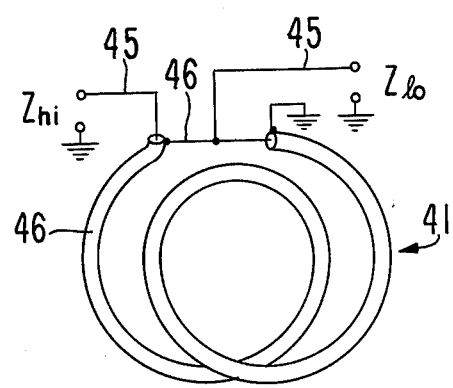
FIG. 5 is a physical implementation of the transmission line transformer of FIG. 4.

Referring now to FIG. 5 there is shown a physical realization of the first impedance transformer 41. More particularly, the impedance transformer 41 comprises a length of coaxial line having a characteristic impedance $Z_O$ of 10 ohms and the length $l$ of coaxial line is wound into a coil with the outer conductor 46, at the high impedance end, being connected to the center conductor 45 at the low impedance end with the outer conductor being grounded at the low impedance end. The absence of ferromagnetic material associated with the transformer section 41 facilitates relatively close placement of the transformer section to the sample region 13 within the probe structure 20 without unduly perturbing the uniformity of the polarizing magnetic field within the sample region 13.

Figure 6:
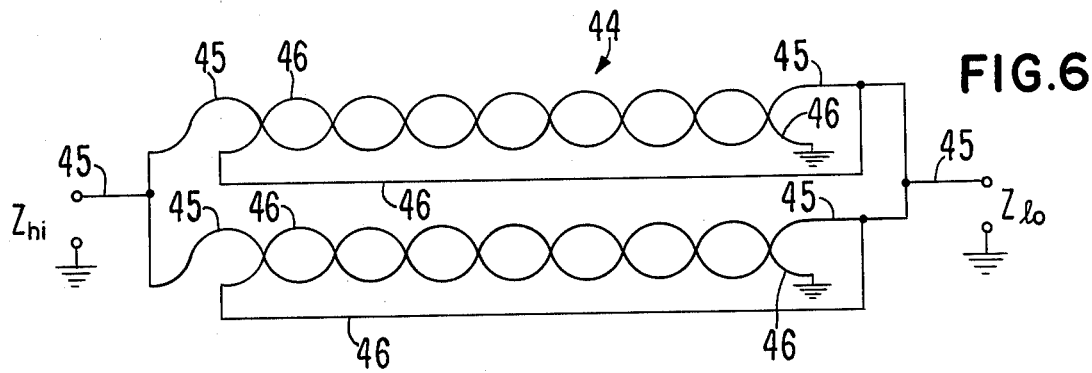
FIG. 6 is an alternative physical implementation of a transmission line transformer employed in the circuit of FIG. 1.
Figure 7:
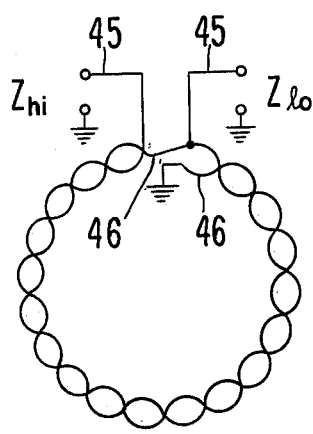
FIG. 7 is a schematic line diagram of a physical implementation of one half of the transformer of FIG. 6, as coiled into a coil.

Referring now to FIG. 6 there is shown a physical realization of the second transformer section 44. The second transformer section 44 has a characteristic impedance of 25 ohms for matching the low impedance end, at 12 ohms, to the high impedance end, at 50 ohms. Actually the transformer section 44 comprises a parallel connection of two transmission line transformer sections each of a characteristic impedance of 50 ohms to provide the composite characteristic impedance for section 44 of 25 ohms. Briefly, each of the parallel transformer sections comprises a twisted pair of 26 gauge enamel insulated wires 45 and 46. As in the embodiment of FIG. 5, each of the twisted pairs is coiled into a coil of several turns in the manner as indicated in FIG. 7 for one of the twisted pairs.

Thus, the total composite transformer 18 provides a 16:1 impedance ratio transformation over a very broad tuning range of 6 to 40 megahertz. This permits a single probe circuit and structure to be employed for sensing nuclear magnetic resonance of $^{14}N$, $^{15}N$, $^{2}H$, $^{13}C$, $^{31}P$, and others.

What is claimed is:

1. In a resonance pick-up circuit of a nuclear magnetic resonance spectrometer:
   magnetic pick-up coil means disposed in radio frequency magnetic field exchanging relation to a nuclear magnetic resonance sample region for sensing nuclear magnetic resonance of a sample in the sample region;
   tuning capacitor means series connected for RF current flow with said pick-up coil means for series resonating the inductance of said magnetic pick-up coil means at a nuclear magnetic resonant frequency of the resonance sample material;
   transmission line transformer means series connected for the series resonant radio frequency current flow with said pick-up coil means and said tuning capacitor means at said series resonance frequency for transforming the relatively low series resonance impedance of said series resonated pick-up coil means to a substantially higher impedance of the input to a radio frequency amplifier;
   said transformer means including first and second elongated conductors having an axially coextensive elongated portion, said transmission line comprising the distributed inductance and capacitance of said first and second coextensive conductors, said first conductor being series connected with said series resonated pick-up coil for flow of series resonant radio frequency current therethrough of one phase and for inducing a radio frequency current flow of opposite phase in said second conductor; and means for coupling the induced current in said second conductor onto the end of said first conductor, which faces toward said pick-up coil means, in phase with the current flow in said first conductor so that at the end of said first conductor facing said pick-up means there is the sum of the current flow in said first and second conductors and at the opposite end of said first conductor, which faces toward the amplifier, there is only the series resonant current flow on said first conductor.

2. The apparatus of claim 1 wherein said transmission line transformer means comprises a pair of said transformer means series connected with said resonated pick-up coil means.

3. The apparatus of claim 1 wherein said first and second elongated conductors are twisted together as a twisted pair.

4. The apparatus of claim 1 wherein said first and second elongated conductors comprise a coaxial line means having an inner conductor as one of said conductors and an outer conductor surrounding said inner conductors as the other one of said conductors.

5. The apparatus of claim 1 wherein said first and second conductors are coiled into a coil.

6. The apparatus of claim 3 wherein said first and second twisted conductors are coiled into a coil.

7. The apparatus of claim 4 wherein said coaxial line is coiled into a coil.

8. The apparatus of claim 1 wherein said transformer means includes a pair of said transformer means parallel connected to each other and series connected with said resonated pick-up coil means for reducing the characteristic impedance $Z_O$ of said transformer means.

9. The apparatus of claim 8 wherein each of said transformer means comprises a pair of said first and second elongated conductors twisted together as a twisted pair.

10. The apparatus of claim 9 wherein said pair of parallel transformer means are coiled into a coil.

11. The apparatus of claim 1 including means for exciting said pick-up coil means with radio frequency current to excite resonance of the sample and receive means coupled to said pick-up coil means for receiving the resonance signals emanating from the excited resonant sample for producing an output resonance signal.

12. The apparatus of claim 11 including means for scanning the resonance conditions to derive a resonance spectrum of the sample.

* * * * *